US006955720B2

(12) United States Patent
Gurer et al.

(10) Patent No.: US 6,955,720 B2
(45) Date of Patent: Oct. 18, 2005

(54) PLASMA DEPOSITION OF SPIN CHUCKS TO REDUCE CONTAMINATION OF SILICON WAFERS

(75) Inventors: Emir Gurer, Scotts Valley, CA (US); Ed C. Lee, Cupertino, CA (US); Richard Savage, Scotts Valley, CA (US)

(73) Assignee: ASML Holding N.V. (NL)

(*) Notice: Subject to any disclaimer, the term of this patent is extended or adjusted under 35 U.S.C. 154(b) by 0 days.

(21) Appl. No.: 09/874,073

(22) Filed: Jun. 4, 2001

(65) Prior Publication Data

US 2001/0044217 A1 Nov. 22, 2001

Related U.S. Application Data

(63) Continuation of application No. 09/275,360, filed on Mar. 23, 1999, now Pat. No. 6,242,364.

(51) Int. Cl.[7] .......................... H01L 21/00; C23C 16/00

(52) U.S. Cl. ......................... 118/52; 118/724; 118/725; 118/728; 118/500; 156/345.51; 156/345.53; 156/915; 279/3

(58) Field of Search ........................... 118/52, 715–730, 118/500; 156/345.51, 345.53, 915; 279/3

(56) References Cited

U.S. PATENT DOCUMENTS

| | | | | |
|---|---|---|---|---|
| 4,199,650 A | | 4/1980 | Mirtich et al. | 428/421 |
| 4,451,349 A | | 5/1984 | Yeh | 204/298 |
| 4,604,181 A | | 8/1986 | Mirtich et al. | 204/298 |
| 5,158,644 A | | 10/1992 | Cheung et al. | 156/643 |
| 5,294,257 A | | 3/1994 | Kelly et al. | 118/52 |
| 5,357,015 A | | 10/1994 | Haruvy et al. | 528/10 |
| 5,403,459 A | | 4/1995 | Guo | 204/192.32 |
| 5,449,411 A | | 9/1995 | Fukuda et al. | 118/723 |
| 5,464,499 A | | 11/1995 | Moslehi et al. | 216/71 |
| 5,503,676 A | | 4/1996 | Shufflebotham et al. | 118/723 |
| 5,507,874 A | | 4/1996 | Su et al. | 134/1 |
| 5,647,953 A | * | 7/1997 | Williams et al. | 134/1.1 |
| 5,660,895 A | | 8/1997 | Lee et al. | 427/579 |
| 5,868,848 A | * | 2/1999 | Tsukamoto | 118/723 E |
| 5,904,778 A | * | 5/1999 | Lu et al. | 118/723 R |
| 6,110,284 A | * | 8/2000 | Chen et al. | 118/715 |
| 6,120,660 A | * | 9/2000 | Chu et al. | 204/298.15 |
| 6,149,727 A | * | 11/2000 | Yoshioka et al. | 118/500 |

FOREIGN PATENT DOCUMENTS

| | | | | |
|---|---|---|---|---|
| JP | 52084964 A | * | 7/1977 | H01L/21/205 |
| JP | 53066164 A | * | 6/1978 | H01L/21/205 |
| JP | 09260471 A | * | 10/1997 | H01L/21/68 |
| JP | 10321545 A | * | 12/1998 | H01L/21/26 |

* cited by examiner

*Primary Examiner*—P. Hassanzadel
*Assistant Examiner*—Ram N Kackar
(74) *Attorney, Agent, or Firm*—Blakely, Sokoloff, Taylor & Zafman

(57) ABSTRACT

An apparatus for delivering a fluidic media to a wafer includes a housing defining a process chamber. A fluidic media delivery member is coupled to the process chamber. A rotatable chuck is positioned in the process chamber. The rotatable chuck has a wafer support surface coated with a coating material. A vacuum supply line is coupled to the rotatable chuck.

11 Claims, 6 Drawing Sheets

Minimization of Surface Contact Area

Coating uniformity is not compromised when the wafer-to-chuck contact "dimples" are reduced by 50%.

| Coat Parameter | Std Chuck | Reduced Dimple Chuck |
|---|---|---|
| X-Wafer Uniformity | 7.5 | 6 |
| W-W Uniformity | 3.89 | 1.84 |

Coating Uniformity: Std Chuck vs Reduced Dimple Chuck

Minimization of Surface Contact Area

Significant reductions in backside contamination is achieved when reducing the number if wafer contact sites.

| Wafer # | Std Chuck | Reduced Dimple Chuck | % Reduction |
|---|---|---|---|
| 1 | 13587 | 7914 | 41.8 |
| 2 | 8997 | 5885 | 34.6 |
| 3 | 6524 | 5031 | 22.9 |

PLASMA DEPOSITION OF SPIN CHUCKS TO REDUCE CONTAMINATION OF SILICON WAFERS

This is a Continuation of application Ser. No. 09/275,360, filed Mar. 23, 1999 now U.S. Pat. No. 6,242,364.

BACKGROUND OF THE INVENTION

1. Field of the Invention

This invention relates to an apparatus that delivers a fluidic media to a semiconductor wafer, and more particularly to depositing a thin film of a dielectric material on a surface of a spin chuck that is used in semiconductor manufacturing.

2. Description of Related Art

Plasma processing of semiconductor work pieces involves the performance of one or more plasma processes such as gas chemistry etching, gas chemistry deposition, physical sputtering, or rapid thermal annealing on one or more semiconductor work pieces/wafers within the plasma chamber. As the geometries of semiconductor devices become ever so smaller, the ability to maintain the uniformity and accuracy of critical dimensions becomes strained. Many of the processes carried out within semiconductor processing reactors leave contaminant deposits throughout the process chamber which accumulate and become the source of particulate matter harmful to the creation of a semiconductor device. As these processes become ever faster and the dimension size of the semiconductor device has become ever smaller, the presence of particulate matter upon the surface of the semiconductor work piece has become more of a risk factor. Consequently, the cleanliness of plasma processing chambers (i.e. plasma etching, reactive ion etching (RIE), plasma enhanced chemical vapor deposition (PECVD), etc.) is critical.

Silicon wafers that are used in semiconductor manufacturing are processed by spin coating a photoactive film, a photoresist, and are then patterned with a desired electronic circuit by photolithography. During this process the wafers are held by a vacuum chuck from their backside while the resist material is applied to the opposite side. The spin chuck leaves a fingerprint of contamination of the backside of the wafer. This fingerprint is mainly attributed to some form of material transfer between the chuck and the silicon surface of the wafer. Contamination can cause a deformation in the focal plane of the wafer during the exposure process which can cause a distortion in the critical features imaged into the resist layer at the site of the contamination. Yields are compromised.

Transfer of contamination from the chuck to the wafer can occur during movement of the wafer into place on the surface of the spin chuck and when vacuum is applied to the wafer when it is supported on the spin chuck. Additional problems are encountered when there are hundreds of contact points between the wafer and the spin chuck.

There is a need for an apparatus and method for a spin chuck with a wafer support surface that provides a reduction in the number of contaminants transferred from the spin chuck to a wafer. There is a further need for an apparatus and method for a spin chuck with a dielectric material on the wafer support surface that provides a cleaning of the wafer support surface. Another need exists for a spin chuck where the application of a dielectric material to the wafer support surface promotes a cross-linking of material of the wafer support surface. Still a further need exists for a spin chuck with a wafer support surface with a coated wafer support surface that provides an encapsulation of particulate matter found on the wafer support surface. Yet another need exists for a spin chuck with a reduced number of contact points between a wafer support surface of the chuck and a wafer positioned on the wafer support surface. A further need exists for a spin chuck with a sufficiently large enough wafer support surface that serves as a thermal shield for a wafer positioned on the wafer support surface and minimizes variations in wafer temperature in the radial direction.

SUMMARY OF THE INVENTION

Accordingly, an object of the invention is to provide spin chuck apparatus that provides for a reduction in contamination delivery to a wafer supported on the spin chuck.

Another object of the invention is to provide an apparatus for delivering a fluidic media to a wafer that includes a spin chuck coated with a dielectric material.

Still another object of the present invention is to provide a spin chuck apparatus that provides for a reduction in magnitude of radial thermal gradients of a wafer supported on the spin chuck.

A further object of the present invention is to provide a spin chuck apparatus that provides for a more uniform deposition of a material on a wafer positioned on the spin chuck.

Yet another object of the present invention is to provide a spin chuck apparatus with a wafer support surface and a skirt positioned at a periphery of the wafer support surface.

A further object of the invention is to provide a method of treating a spin chuck and reduce transfer of contamination from the spin chuck to a wafer.

Another object of the present invention is to provide a method for applying a uniform layer of material on a wafer positioned on a spin chuck These and other objects of the invention are achieved in an apparatus for delivering a fluidic media to a wafer. The apparatus includes a housing defining a process chamber. A fluidic media delivery member is coupled to the process chamber. A rotatable chuck is positioned in the process chamber. The rotatable chuck has a wafer support surface coated with a dielectric material. A vacuum supply line is coupled to the rotatable chuck.

In another embodiment, an apparatus for delivering a fluidic media to a wafer includes a housing that defines a process chamber. A fluidic media delivery member is coupled to the process chamber. A spin chuck is positioned in the process chamber. The spin chuck has a wafer support surface and a skirt positioned at a periphery and in a non-planar relationship to the wafer support wafer surface. A vacuum supply line coupled to the spin chuck.

In yet another embodiment, a wafer processing apparatus includes a housing, and first, second and third wafer transporters positioned in the housing. Also in the housing is a process station coupled to each of the first, second and third wafer transporters. The process station includes a plurality of wafer processing modules. Each module has a rotatable chuck with a wafer support surface coated with a dielectric material.

In still another embodiment, a method is provided for treating a spin chuck in order to reduce transfer of contamination from the spin chuck to a wafer positioned on the spin chuck. The spin chuck is positioned in a treatment chamber. A thin film deposition process is used to coat the wafer support surface with a dielectric material.

In another embodiment, a method is provided for applying a uniform layer of material on a wafer positioned on a spin chuck. A spin chuck is provided. The spin chuck has a wafer support surface and a skirt positioned at a periphery and in a non-planar relationship to the wafer support wafer surface. The wafer is positioned on the wafer support surface. Material is delivered to the wafer while the spin chuck is spinning. A uniform layer of material is formed on the wafer.

BRIEF DESCRIPTION OF THE FIGURES

FIG. 3(*b*) is a side perspective view of a prior art chuck-to-wafer support that has a planar surface contact.

FIG. 3(*c*) is a side perspective view of a chuck-wafer support of the present invention that is a point contact rather than the larger planar surface contact of FIG. 3(*b*).

DETAILED DESCRIPTION

Figure 1:
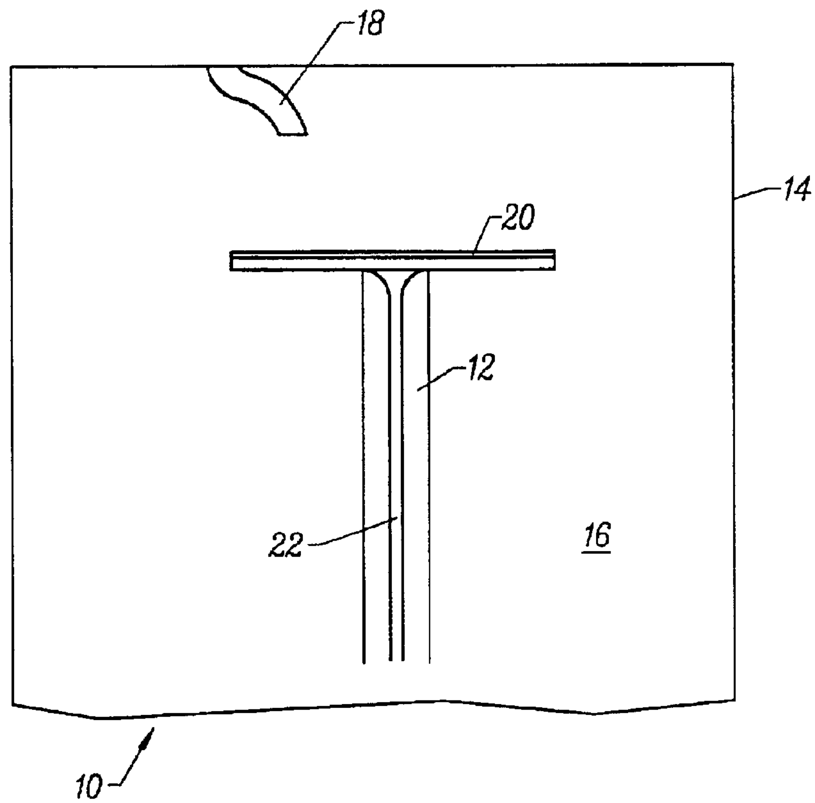
FIG. 1 is a cross-section view of one embodiment of a spin chuck of the present invention with a dielectric coated wafer support surface that is positioned in a process chamber.

Referring now to FIG. 1, an apparatus for delivering a fluidic media to a substrate is generally denoted as shown by 10. In one embodiment, the substrate is a wafer utilized in the semiconductor industry. A spin chuck 12 is positioned in a housing 14 that defines a process chamber 16. Spin chuck 12 can be made of a variety of materials well known to those skilled in the art. A fluidic media delivery member 18 is in process chamber. Fluidic media delivery member 18 can deliver a variety of different fluidic materials to the wafer including but not limited photoresist, developer fluid, anti-reflective coating, de-ionized water, spin on dielectric material, organic solvent and the like.

A top surface of spin chuck 12 supports wafers and is hereafter referred to as a wafer support surface 20. Wafer support surface is coated with a coating material. Suitable coating materials include but are not limited to $SiO_xCHy$ where x is from 1–2 and y is from 0–3, and $SiO_x N_aH_b$, wherein x is from 1–2, a is from 0–1 and b is from 0–1. In the preceding sentence, the amount of constituients can be fractions that fall between 0 and 3, 1 e.g., 0.1, 1.3, 2.9. Preferably, the coating material has a sufficient hardness to minimize a transfer of material from the chuck to the wafer when the wafer is positioned or removed from the chuck, and minimize a transfer of material from the wafer to the chuck. Also preferably, the coating material has a hardness that is less than the material of the wafer. Thus, the selection of coating material, and its hardness properties, is dependent on the composition of the wafer. When the wafer is made of silicon, then a coating material is selected with a hardness less than silicon.

The coating material is deposited on the wafer film depositions methods including but not limited to CVD, plasma enhanced chemical vapor deposition process, flame spray, e-beam, laser induced deposition, and the like.

Coupled to spin chuck 12 is a vacuum supply line 22. Vacuum supply line is in turn coupled to a vacuum source (not shown).

Figure 2:
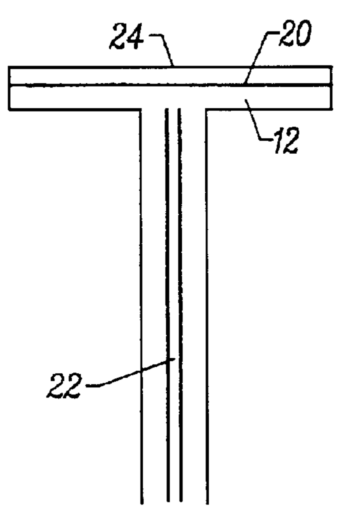
FIG. 2 is a close-up, perspective view of the spin chuck of FIG. 1.

Referring now to FIG. 2, the coating material is represented as a layer 24. In various embodiments, layer 24 has a thickness in the range of thickness of 0.05–100 microns, preferably 0.05–1 microns, more preferably 1–10 microns and still more preferably 10–100 microns. Layer 24 provides an improved smoothness of wafer support surface 20.

The process of application of the coating material to wafer support surface 20 provides a number of functions including but not limited to. (i) reduces the number of contaminants transferred from spin chuck 12 to the underside of the wafer, (ii) cleans wafer support surface 20, (iii) promotes a cross-linking of the material that forms wafer support surface 20 and (iv) provides an encapsulation of particulate matter found on wafer support surface 20.

Figure 3A:
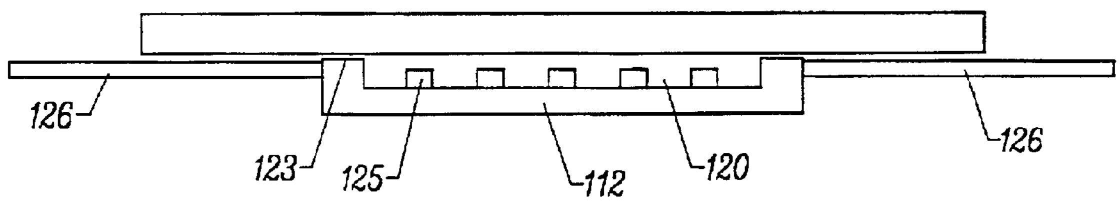
FIG. 3(*a*) is a side perspective view of the spin chuck of FIG. 1, illustrating an embodiment with a thermal shield skirt positioned at a periphery of the wafer support surface of the spin chuck.
Figure 3B:
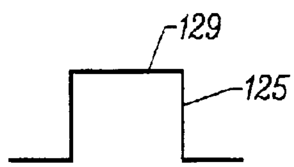
Figure 3C:

Referring now to the embodiment of FIG. 3(*a*), wafer support surface 120 includes a vacuum ring 123 and support structures 125 that touch the underside of a wafer. Spin chuck 112 includes a skirt 126. Skirt 126 is positioned at a periphery and in a non-planar relationship to wafer support wafer surface 120. Wafer support surface 120 provides mechanical support for a wafer 128. Skirt 126 is positioned to be in a non-mechanical supporting position relative to wafer 128. In one embodiment, skirt 126 is sized to permit a wafer 128 positioned on the wafer support surface 128 to extend beyond a periphery of skirt 126. In another embodiment, skirt 126 and wafer support surface 120 are sized to be at least equal to a size of a wafer 128 positioned on spin chuck 112.

Skirt 126 is sized to reduce a magnitude of radial thermal gradients in wafer 128 positioned on spin chuck 112. Additionally, skirt 126 is sized to reduce a magnitude of radial thermal gradients introduced to wafer 128 positioned on spin chuck 112 in process chamber 116. Skirt 126 reduces a magnitude of radial thermal gradients introduced to wafer 128 positioned on spin chuck 112 from process chamber 116. This enhances uniformity of material thickness on a surface of wafer 128.

Wafer support surface 120 can have a reduced number of support structures 125 as compared to conventional spin chucks. The reduction in number of support structures 125 can be 25% or greater, and more preferably 50% or greater.

Referring now to FIG. 3(*b*), a cross-sectional view of a prior art support support 123 is illustrated. The chuck-to-wafer contact area is denoted as 129 and is a planar surface contact. Referring now to FIG. 3(*c*), the present invention provides support structures 123' that are point contacts 129'. Point contacts 129' are single points as compared to the planar surface contact 129 of FIG. 3(*b*). Point contacts 129' reduce the number of contaminant transfers from spin chuck 112 to wafer 128, as more fully described below. Additionally, the present invention provides vacuum rings 123 that are line contacts instead of planar surface contacts.

Figure 4:
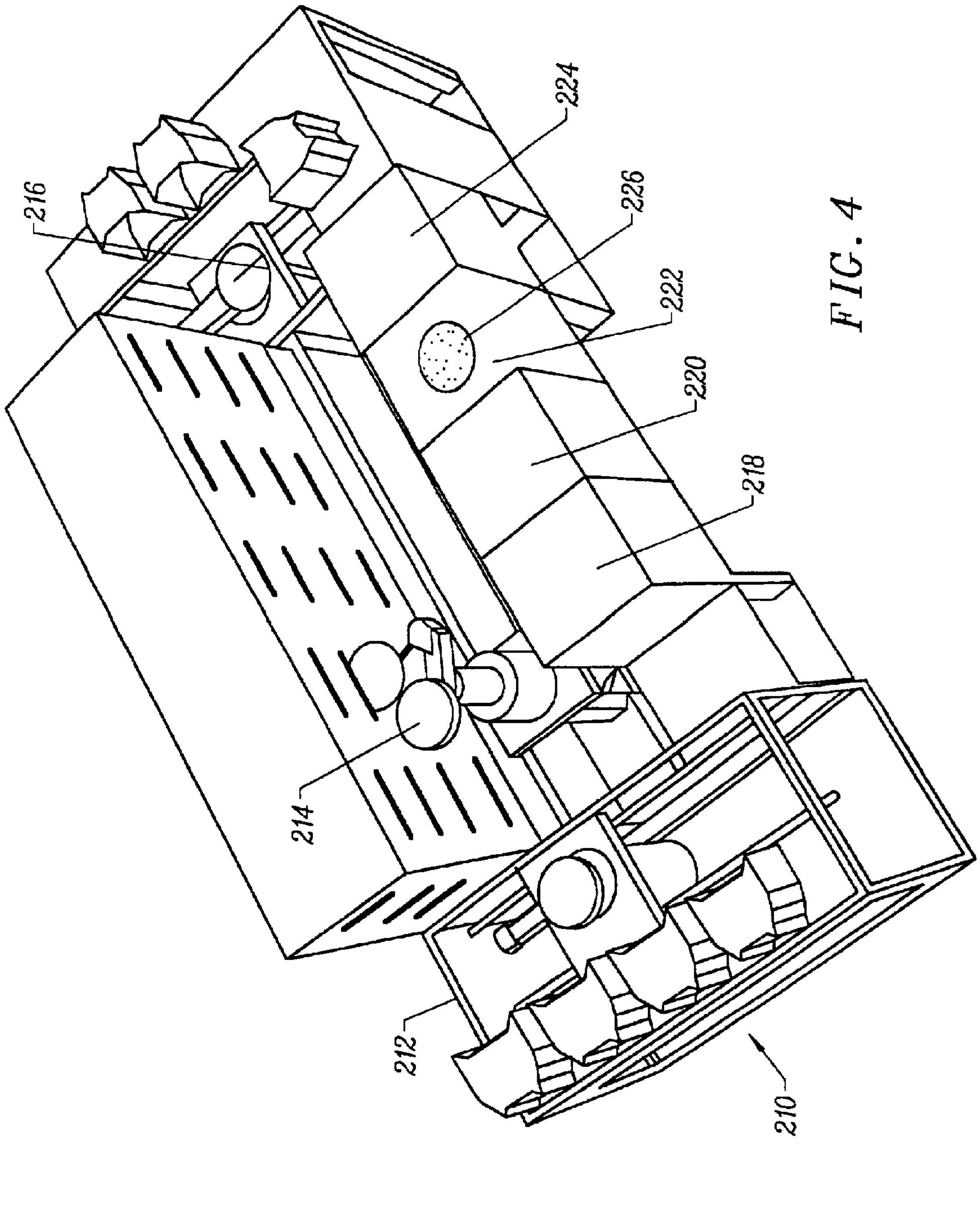
FIG. 4 is a perspective view of a wafer processing apparatus that includes four process modules, each including the spin chuck of FIG. 1.

In another embodiment, as illustrated in FIG. 4, a wafer processing apparatus 210 includes a housing 212, a first wafer transporter 214, a second wafer transporter 216 and a process station coupled to first and second wafer transporters 214 and 216. The process station includes a plurality of wafer processing modules. As shown in FIG. 4, four wafer processing modules 218, 220, 222 and 224 are shown. Each module 218, 220, 222 and 224 a spin chuck 226 is positioned in each module 218–224. Spin chucks 226 each include the coating on FIG. 1.

Figure 5:
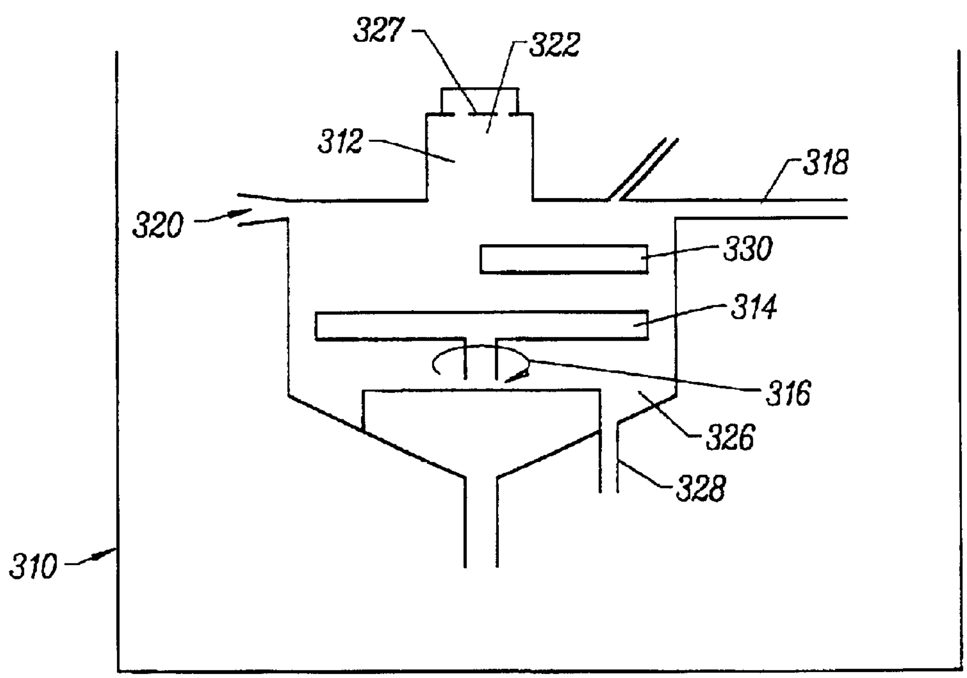
FIG. 5 is a cross-sectional view of a plasma chamber used to coated a spin chuck with a dielectric to form the spin chuck illustrated in FIG. 1.

In one embodiment, illustrated in FIGS. 5, a plasma process is used to coated the spin chuck with the coating. Housing 310 defines a chamber 312. Spin chuck 314 is positioned in a plasma generating chamber 312 and is mounted for rotation of a drive shaft 316. Process gases for controlling the atmosphere which the coating Process occurs are passed into plasma generating chamber 312 through an inlet 318. An outlet 320 provides for the exhaustion of gases from plasma generating chamber 312. A plasma generating assembly is positioned at the top of plasma generating chamber 312 and can include a waveguide 322 coupled to a microwave or RF field generator (not shown) and communicates with plasma generating chamber 312. A plasma gas injector 324 passes a mixture of gas into plasma generating chamber 312 to coat spin chuck 314 with the coating.

The RF power determines current and voltage between the RF electrodes. RF frequency defines the number and energy of electrons, ions and chemical species and thus the bombardment flux and energy. Additional parameters in the use of a plasma process to coat spin chuck 314 include, (i) pressure to determine chemical species, their concentration and residence times, (ii) gas flow rate, (iii) gas composition, (iv) gas and surface temperatures, (v) electrode potential, (vi) sample bias and (vii) reactor geometry. A more detailed description is found in U.S. Pat. No. 5,503,676, incorporated herein by reference.

Again referring to FIG. 5, liquid spun from a wafer being coated is collected in a waste coating sump 326 and removed by coating waste drain 328. A photoresist coating application 330 can also be positioned in a different plasma generating chamber.

EXAMPLE 1

In one embodiment of the present invention, spin chucks 12 are coated with a dielectric with a film thickness in the range of 1000–2000 Å.

Deposition Technique

Plasma enhanced chemical vapor deposition (PECVD)

Main gas used: Organosilicon materials+a carrier gas ($N_2$,Ar,He)

a) Film type: Silicon dioxide with organic content ($CH_3$)
Stoichiometry: Slightly non-stoichiometric ($SiO_xCH_y$), where x=1–2, y=0–3

Alternative Deposition chemistry:

(b) Silicon dioxide/Oxynitrides: $SiO_xN_aH_b$

Stoichiometry: x=1–2,a =0–1, b=0–1

Gases used: Silane ($SiH_4$)+(oxidizers, Nitriders)

Oxidizers: $N_2O$, $O_2$, CO2, TEOS $(C_2H_5O)_4Si$, Tetraethylorthosilicate
Nitrider: $NH_3$ A preferred chemistry:

$SiH_4+N_2O \rightarrow$ Silicon dioxide $SiH_4+NH_3+N_2 \rightarrow$ Silicon Nitride

| | Silicon Dioxide | Silicon Nitride |
|---|---|---|
| Gases | $SiH_4 + N_2O$ | $NiH_4 + NH_3 + N_2$ |
| % $SiH_4$ | 2% | 9% |
| % $N_2O$, $NH_3$ | 98% ($N_2O$) | 45% ($NH_3$) |
| Film composition | $SiO_{1\ 9}N_{0\ 15}$ | $Si_{3\ 2}N_4$(H2) |
| RF Power density | 0.05 W/cm$^2$ | 0.17 W/cm$^2$ |
| RF Frequency | 57 kHz | 57 kHz |
| Operating pressure | 53 Pa | 33 Pa |
| Substrate pressure | 300 C. | 300 C. |
| Deposition rate | 60 nm/min | 38 nm/min |

Final film properties are extremely dependent on the process conditions. For example, relative ratio of $N_2O/NH_3$ determines film stoichiometry. Gas ratios depends on reactor type.

The stoichiometry of plasma oxide films can be adjusted by changing deposition process variables. Please see attached documents for detailed discussion of impact of process variables on the film properties. One advantage of plasma oxide is that its hydrogen content is much lower than that of plasma nitride (2–3% versus 20–30%). In general, hydrogen content of these films is hard to quantify thus more uncertainty exists about H content of these films.

EXAMPLE 2

In this example, spin chucks with a reduced number of chuck-to-wafer contact points were coated with $SiO_x$. The result was reduced backside contamination of wafers. All particle measurements (0.3 $\mu$m to 10.0 $\mu$m) were obtained with the use of a Surfscan 6420 Tencor Instrument, available from Tencor Instruments, Milpitas, Calif.

Figure 6:
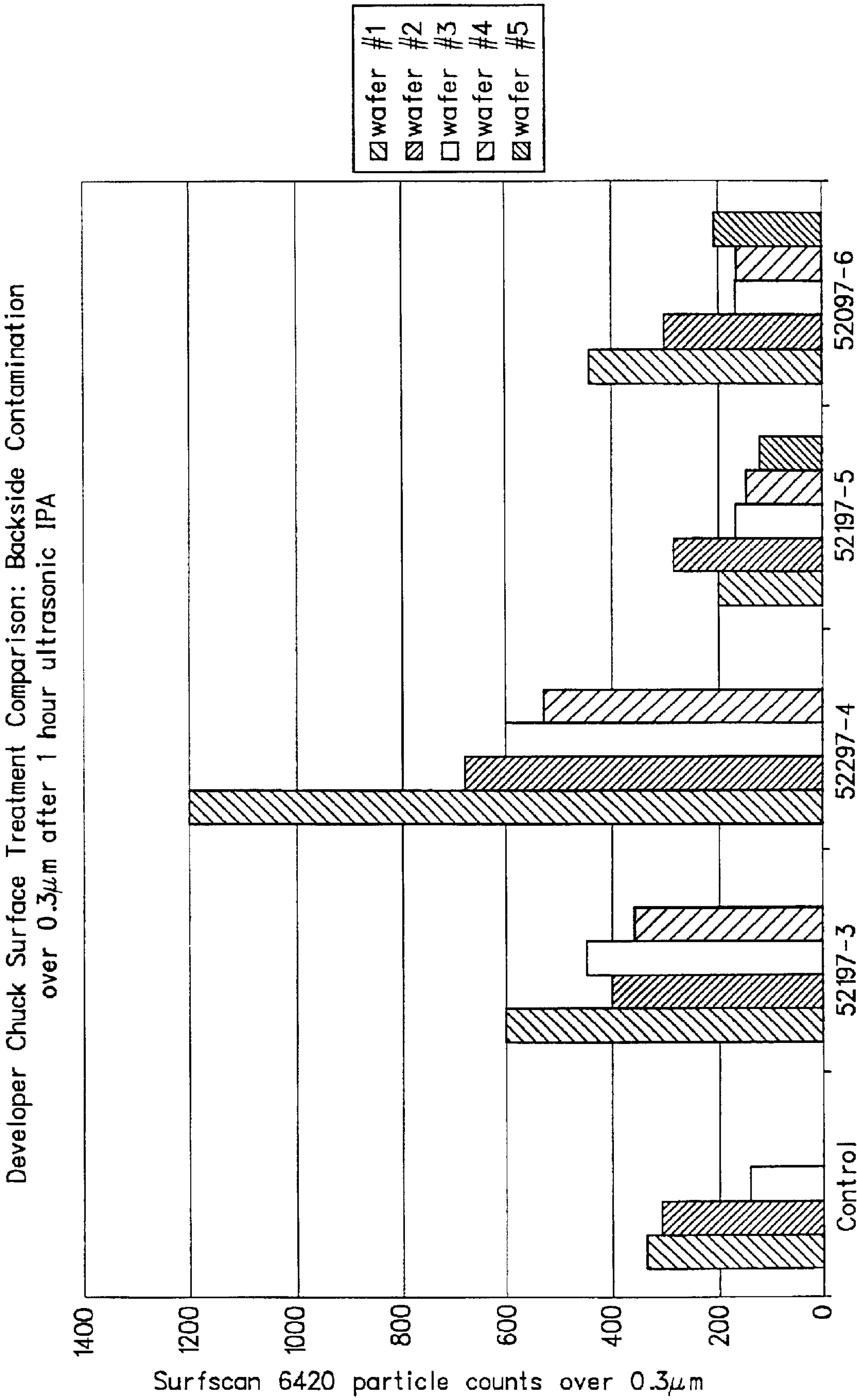
FIG. 6 is a graph illustrating a reduction in wafer backside contamination by coated spin chucks with a reduced number of chuck-to-wafer support structures.

The spin chucks were placed in an ultrasonic bath using a high grade IPA for one hour. Vibration was applied from ultrasonic inducement. The chucks were dried by a nitrogen gun and then placed on a developer spindle after the removal of the spin chuck and air ring. A recipe flow was created for the wafers to pass through the ces –>dev 18–>ces. Ten wafers were passed through this flow. Upon completion, the track was placed in the service mode, using component exercise, chuck vacuum was applied to the prime wafer face down for 10 secs, then off. This test was repeated for each chuck. The wafers were then measured on the Surfscan 6420 for particle counts. Chuck 1 was a control. The results of the particle count are presented in the graph of FIG. 6.

EXAMPLE 3

Figure 7:
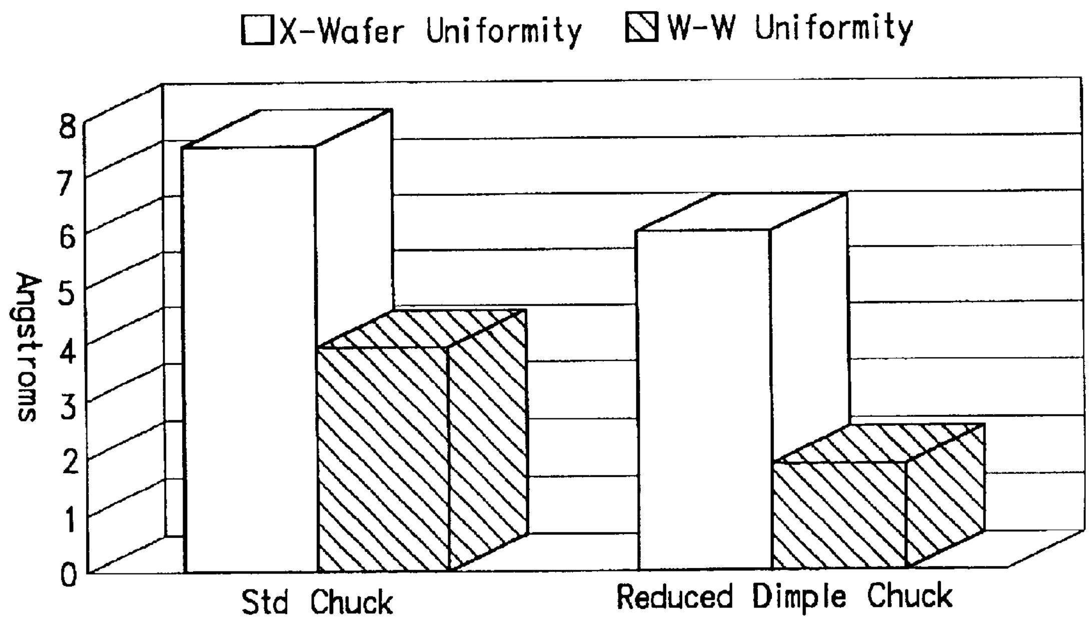
FIG. 7 is a graph illustrating that uniform coating of wafers is achieved with spin chucks that are coated with dielectric materials and have a reduced number of wafer-to-chuck support structures.

Spin chucks with a reduced number of wafer-to-chuck contact points were coated with $Si_xO_y$, Measured coating uniformity of wafers improved when the number of contact points was reduced by 50%, as illustrated in the graph of FIG. 7.

EXAMPLE 4

Figure 8:
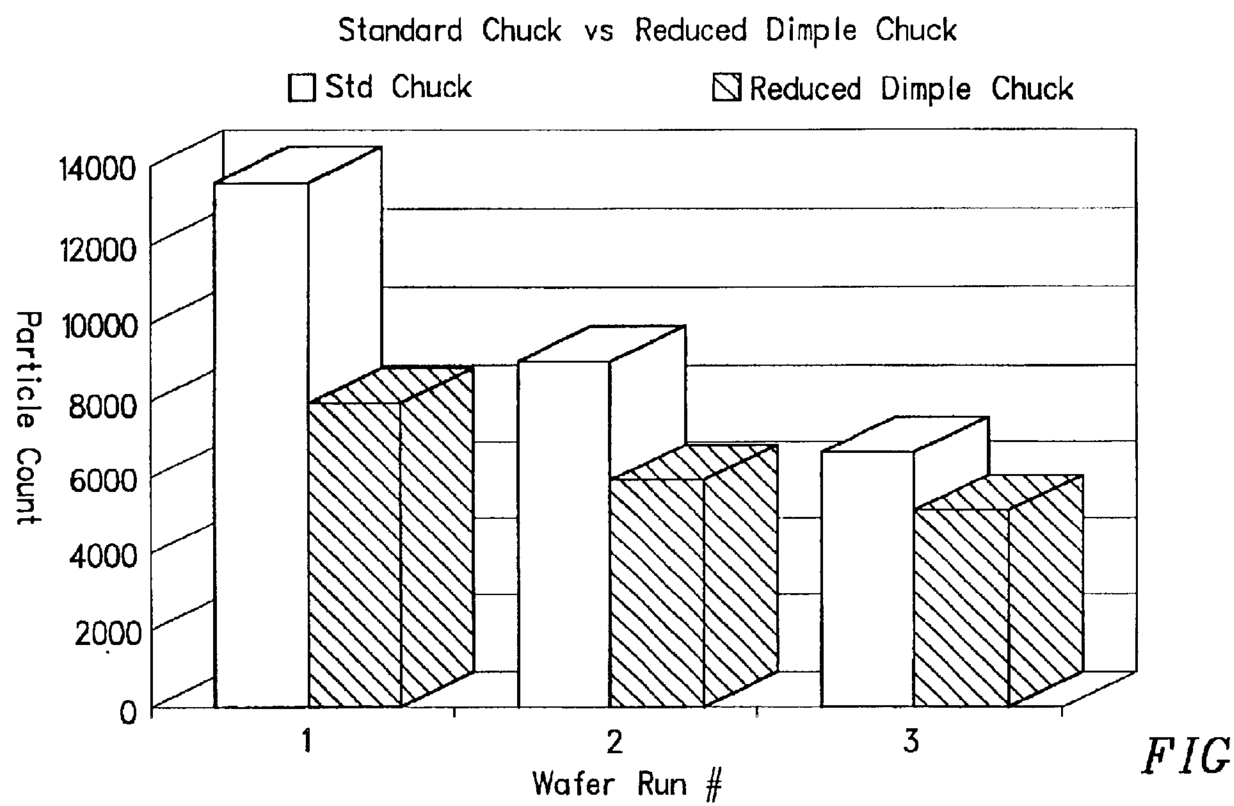
FIG. 8 is a graph illustrating a reduction in wafer backside contamination by non-coated spin chucks with a reduced number of chuck-to-wafer support structures.

The graph of FIG. 8 illustrates that by reducing the number of wafer-to-chuck contact points particle contamination by un-coated chucks was reduced by 41.8%, 34.6% and 22.9% respectively.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An apparatus for delivering media to a wafer, comprising:

a housing defining a process chamber;

a spin chuck positioned in the process chamber, the spin chuck having a wafer support surface, the wafer support surface coated with a coating layer such that at least a portion of a particulate matter on the wafer support surface is encapsulated by the coating layer; and a skirt positioned at a periphery and in a non-planer relationship to the wafer support surface such that a magnitude of radial thermal gradients in a wafer positioned on the spin chuck is reduced, wherein a lateral edge of the skirt contacts a lateral edge of the wafer support surface, is in non-mechanical supporting position relative to the wafer and is sized to permit a wafer positioned on the wafer support surface to extend beyond a periphery of the skirt.

2. An apparatus of claim 1, wherein the coating layer is comprised of a dielectric coating material.

3. The apparatus of claim 1, wherein the coating layer has a composition including a substance from the chemical family $SiO_xCH_y$, with x ranging from 1–2, inclusive, and y ranging from 0–3, inclusive.

4. The apparatus of claim 1, wherein the coating layer material has a mechanical hardness equal to $hardness_{coatinglayer}$, and silicon has a mechanical hardness equal to $hardness_{silicon}$, and wherein $hardness_{coatinglayer}$ is less than $hardness_{silicon}$.

5. The apparatus of claim 4 wherein the mechanical hardness of the coating layer is sufficient to reduce a transfer of material from the wafer support surface to wafer.

6. The apparatus of claim 1, wherein the coating layer has a thickness in the range of 0.5–100 micrometers.

7. The apparatus of claim 1, wherein the skirt and wafer support surface are sized to be at least equal to a size of a wafer positioned on the wafer support surface.

8. The apparatus of claim 1 wherein the wafer support surface has formed thereon a plurality of non-planar wafer contact points.

9. The apparatus of claim 1 wherein the coating layer promotes a cross-linking of a material comprising the wafer support surface.

10. An apparatus of claim 1 wherein the wafer support surface includes a line contact vacuum ring.

11. The apparatus of claim 10 wherein the wafer support surface has formed thereon plurality of non-planar wafer contact points.

* * * * *